United States Patent [19]

McGrogan, Jr.

[11] 3,879,663

[45] Apr. 22, 1975

[54] DELTA MODULATOR UTILIZING A DUTY CYCLE CIRCUIT

[75] Inventor: Ellwood Patrick McGrogan, Jr., Cherry Hill, N.J.

[73] Assignee: RCA Corporation, New York, N.Y.

[22] Filed: Oct. 9, 1973

[21] Appl. No.: 404,799

[52] U.S. Cl. ............................ 325/38 B; 332/11 D

[51] Int. Cl. .......................................... H03k 13/22

[58] Field of Search ........ 325/38 R, 38 B; 332/11 D

[56] References Cited

UNITED STATES PATENTS 3,746,990 7/1973 Le Diberder et al. ............ 325/38 B 3,806,806 4/1974 Brolin ............................. 325/38 B

*Primary Examiner*—Benedict V. Safourek

*Attorney, Agent, or Firm*—Edward J. Norton; Joseph S. Tripoli

[57] ABSTRACT

A delta modulation system for encoding and decoding an analog input signal. The encoder includes a comparator to generate an encoded digital signal representing the analog input signal and a duty cycle circuit to represent the slope of the analog input signal. The decoder utilizes a similar duty cycle circuit which operates on the encoded digital signal received in order to translate the encoded signal into an analog output signal.

14 Claims, 7 Drawing Figures

DELTA MODULATOR UTILIZING A DUTY CYCLE CIRCUIT

Figure 1:
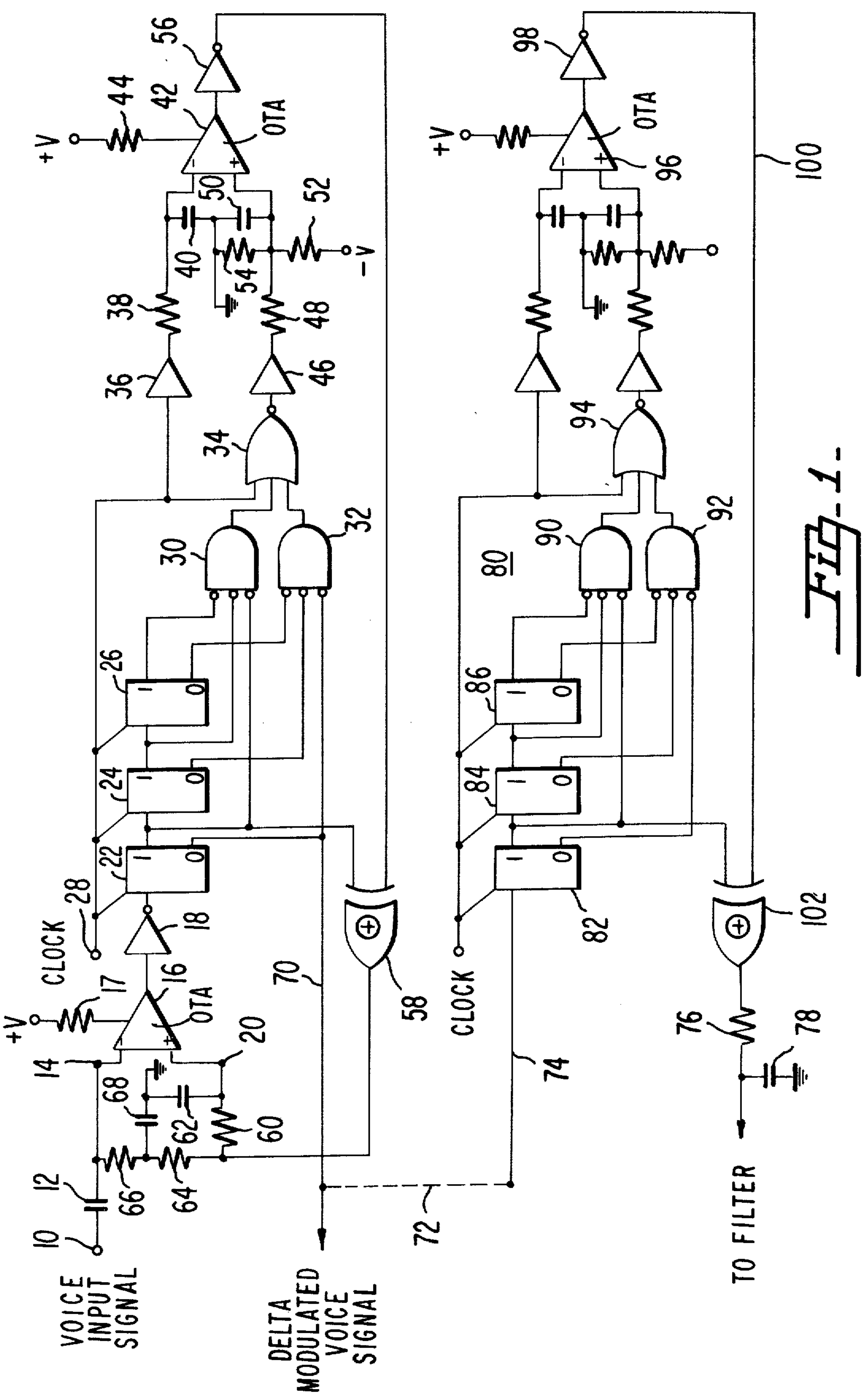

The present invention relates to digital transmission systems and more particularly, to delta modulation transmission systems.

Delta modulators are widely used for digitally encoding analog signals, especially analog speech signals, in preparation for transmission. Delta modulators are especially useful for speech encoding because the delta modulator frequency response is similar to the energy spectrum of speech. In addition, delta modulators are a popular means for digitizing speech because they are relatively simple to implement and are quite tolerant of channel errors.

In a simple delta modulation system, the instantaneous input analog signal is periodically compared to a reference signal and depending upon the result of the comparison of amplitudes a logical one or zero is transmitted. The reference signal used in the comparison is related to the pulse signal just previously transmitted. Thus, the simple delta modulator provides a bit stream output signal which is indicative of the amplitude of the analog signal on a periodically sampled basis.

The simple delta modulator has a limited dynamic range and thus a number of adaptive techniques have been devised to overcome this limitation. Most of the adaptive techniques increase the dynamic range by increasing the step size or magnitude of the reference level each time the comparison results in an answer similar to the one just previously obtained. That is, if on the first comparison the reference signal is less than the input signal, the reference level is increased by a certain step size. On the next comparison if the reference level is still less than the input signal, the step size itself is increased thus increasing the reference level for an even greater amount than on the first comparison. This type of delta modulator is called a variable slope delta modulator (VSD modulator).

The continuously variable slope delta modulator (CVSD modulator) is a variation of the VSD modulator in which the comparison signal, which is indicative of the slope of the analog input signal is smoothed through a low pass filter with a bandwidth corresponding to the maximum syllabic rate of human speech, approximately 25 to 35 Hz.

Previous CVSD modulators have made extensive use of precision operational amplifiers in the slope generation and polarity switching networks. Such implementations require precision components and/or balancing adjustments for stable operation. Due to the delicate balancing requirements, prior arrangements of CVSD modulators have been overly sensitive to component and power supply tolerances.

The present invention provides a CVSD type modulator encoder-decoder system which operates without the use of precision active elements and balancing adjustments so that the system is relatively insensitive to component tolerances and power supply variations.

In accordance with the present invention there is provided a delta modulation system for translating an analog input signal into an encoded digital signal and for decoding the encoded digital signal into an analog output signal. The system comprises an encoder station and a decoder station. The encoder comprises a signal comparator means, an encoder pulse train generating means, an encoder integrating means and a means associated with the encoder pulse train generating means for providing the encoded digital output signal to a transmission medium. The signal comparator means periodically compares the amplitudes of the analog input signal and a feedback signal which are respectively applied to first and second input terminals of the comparator means. The comparator means provides an output signal which has a first or a second voltage level based on each of the periodic comparisons at an output terminal thereof. The encoder pulse train generating means responds to the comparator output signal to provide a pulse train which has a duty cycle dependent upon the results of the periodic comparisons. The duty cycle of the pulse train thus generated corresponds to the slope of the analog input signal. The encoder pulse train is integrated in the encoder integrating means and the resulting integrated signal is the feedback signal which is provided at the second input terminal of the comparator means. The decoder station comprises: a means for receiving the encoded digital signal from the transmission medium; a decoder pulse train generating means which responds to the encoded digital signal and provides a decoder pulse train which has a duty cycle dependent upon the encoded information in the encoded digital signal; and a decoder integrating means which integrates the receiver pulse train and provides the analog output signal which corresponds to the analog input signal.

In the Drawing

FIG. 1 is a partial block and partial schematic diagram of one embodiment of a delta modulation system in accordance with the present invention; and FIGS. 2 through 7 are waveform diagrams helpful in the explanation of the operation of the system shown in FIG. 1.

Referring now to FIG. 1, an analog input signal, which in the present embodiment is a speech signal, is applied to system input terminal 10. The analog input signal is capacitively coupled via capacitor 12 to the inverting input terminal 14 of operational transconductance amplifier (OTA) 16. The OTA, generally speaking, is a simple amplifier with an input stage consisting of a differential pair and a current source output stage. All of the current sources in the OTA circuit are adjustable by external biases, therefore, the power consumption of the OTA can be tailored to the particular application. The output current from the OTA can be converted to a voltage by buffering the output signal with a CMOS inverter such as inverter 18, which is used as a linear voltage amplifier. An example of a suitable commercially available OTA is designated as CA3060 and is made by the RCA Corporation. OTA 16 is provided with biasing from a source of +V volts via resistor 17. The OTA 16 in combination with inverter 18 comprises a comparator circuit for comparing signals applied to input terminals 14 and 20, which are respectively the inverting and the non-inverting input terminals. Depending upon the results of the comparison either a high or a low voltage level will be provided at the output terminal of inverter 18. Thus the signal provided at the output terminal of inverter 18 is a binary signal whose logical state, that is, a one or a zero, will depend upon the relative amplitude of the signals applied to terminals 14 and 20.

The binary signal generated at the output terminal of inverter 18 is coupled to a multistage shift register, in this case a three stage shift register comprising stages 22, 24 and 26. Each one of the stages 22, 24 and 26 include a high and a low output terminal. A clock signal from a source not shown is applied at terminal 28 and is made available to each of the stages 22, 24 and 26 of the shift register. Thus the information provided at the output terminal of inverter 18 is shifted through the register at a rate determined by the clock signal applied to terminal 28.

In addition, there is provided first and second gates 30 and 32 respectively. Gates 30 and 32 each have three input terminals. Gate 30 has its three input terminals connected to the high or logical one output terminals of each of the stages 22, 24 and 26 of the shift register. Gate 32 has its three input terminals connected to the low or logical zero output terminals of stages 22, 24 and 26 of the shift register. The output terminals of gates 30 and 32 are connected to two of the three input terminals of a gate 34. The other input terminal of gate 34 is connected to terminal 28 to which the clock signal is applied.

The clock signal on terminal 28 is also coupled to the input terminal of a buffer stage 36 which in this case is preferably a CMOS buffer. The output terminal of buffer 36 is coupled to an RC filter comprising resistor 38 and capacitor 40. The junction between resistor 38 and capacitor 40 is connected to the inverting input terminal of a second OTA 42. Biasing for OTA 42 is provided via a voltage source of +V volts coupled through a resistor 44 to the OTA 42.

The output terminal of gate 34 is connected to another CMOS buffer 46. The output terminal of buffer 46 is coupled to the non-inverting input terminal of OTA 42 via another RC low pass filter comprising resistor 48 and capacitor 50. Additional biasing is supplied to the circuit via a source of −V volts and resistors 52 and 54. Capacitor 50 is specifically designed to have a much greater capacitance value than that of capacitor 40. In actual practice, capacitor 50 may have a typical capacitance of 200 times the capacitance of capacitor 40.

The output terminal of OTA 42 is connected to the input terminal of a CMOS inverter 56. The output terminal of CMOS inverter 56 is connected to one of the two input terminals of an exclusive OR gate 58. The other input terminal of exclusive OR gate 58 is connected to the high or logical one output terminal of the first stage 22 of the shift register. The output terminal of exclusive OR gate 58 is connected to an integrating network comprising resistor 60, capacitor 62, and resistors 64 and 66 and capacitor 68. The output terminal of the integrating network is connected to input terminal 20 of OTA 16.

The connections recited thus far comprise a delta modulator encoder which operates in the following fashion. When the analog input signal is coupled to input terminal 14 of OTA 16, a comparison between the signals applied to the two input terminals 14 and 20 of OTA 16 is made. The comparison results in a logical one or zero at the output terminal of inverter 18. Assume that on three successive comparisons, based on the clock frequency, inverter 18 provides three successive ones. The shift register now has a one in each of the stages 22, 24 and 26. Therefore, gate 30 is provided with an output signal which is coupled to one input terminal of gate 34. In the presence of a run of three, the output signal of buffer 46 is a constant level. When this constant level is integrated in the low pass filter comprising resistor 48 and capacitor 50, a very slowly varying or quasi DC level appears at the non-inverting input terminal of OTA 42. As the run persists from clock pulse to clock pulse, this quasi DC level increases in amplitude.

On the other hand, the low pass filter comprising resistor 38 and capacitor 40 which sees a version of the clock signal, integrates this signal and provides a sawtooth waveform at the inverting input terminal of OTA 42. It is preferable to use a clock signal with a 50 percent duty cycle such that the resulting sawtooth waveform is symmetrical.

As a result of the periodic comparisons between the sawtooth waveform and the quasi DC level, the output terminal of inverter 56 provides a pulse train whose duty cycle is dependent upon the comparisons made in OTA 42. The comparisons made in OTA 42 are dependent upon the quasi DC level which is directly related to the detected run of three which originally comes from the comparisons made in OTA 16. Therefore, the pulse train appearing at the output terminal of inverter 56 has a duty cycle which in fact is related to the slope of the analog input signal. In addition, it will be noted that the signal generated at the output terminal of inverter 56 is provided as a result of comparing two signals which are both related to the clock signal.

The function of exclusive OR gate 58 is in effect to provide a means for generating the polarity of the slope which is now encoded in the generated pulse train. By exclusive ORing the generated pulse train with the signals provided at the high output of stage 22 of the shift register, the polarity of the slope may be ascertained.

Figure 2:

The waveforms in FIGS. 2 through 7 will aid in the understanding of the operation of the encoder of FIG. 1. FIG. 2 shows the symmetrical square wave clock signal. Assume that there is no analog input signal, that is, a quiet condition. There will now be an absence of a run of three. In the absence of a run of three, the signal appearing at the output terminal of buffer 46 will be a replica of the square wave clock signal since the clock signal is itself applied to one of the input terminals of gate 34. When the signal at the output terminal of buffer 46 is integrated in the low pass filter comprising resistor 48 and capacitor 50, the quasi DC level will turn out to be exactly the midpoint between supply voltages +V and −V which were used for biases on the CMOS logic gates. With a 50 percent duty cycle for the clock signal this midpoint level is exact and does not depend upon resistor voltage dividers as may be the case in other delta modulators.

Figure 3:
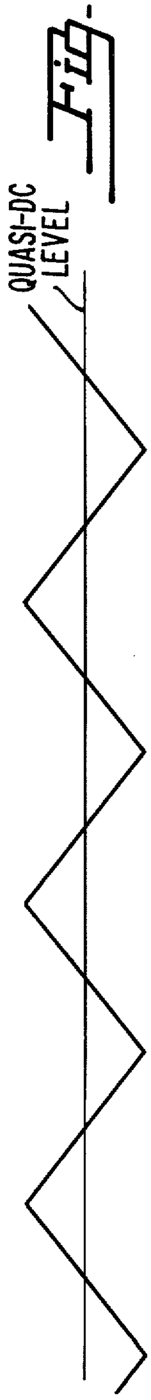

FIG. 3 shows the symmetrical sawtooth waveform which is provided at the inverting input terminal of OTA 42. The straight line through the sawtooth wave of FIG. 3 represents the quiet quasi DC output level supplied to the non-inverting input terminal of OTA 42.

Figure 4:
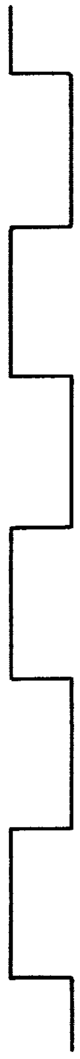

FIG. 4 represents the waveform appearing at the output terminal of inverter 56. It will be noted that the transitions from high to low in FIG. 4 are dependent upon the point at which the sawtooth waveform crosses the quasi DC level in FIG. 3. Thus it will be seen that if the quasi DC level in FIG. 3 should fall as a result of a succession of ones being detected by the logic detection circuit, then the pulse train appearing at the output terminal inverter 56 will have a different pulse width and hence the duty cycle is dependent upon the results from the logic detection circuit.

Figure 5:

The waveform shown in FIG. 5 represents the signal appearing at the high output terminal of stage 22 of the shift register. When the pulse train of FIG. 4 is passed through the exclusive OR gate 58 along with the waveform in FIG. 5, the resulting waveform is that which is shown in FIG. 6.

Figure 6:
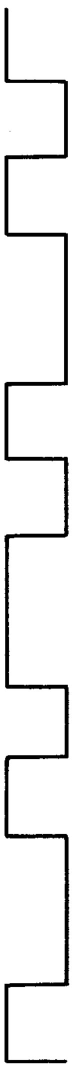
Figure 7:
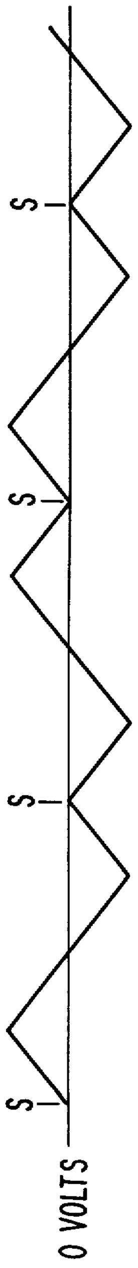

FIG. 7 shows the resulting waveform when the waveform depicted in FIG. 6 is integrated prior to being applied to input terminal 20 of OTA 16. The points labeled S on the waveform of FIG. 7 denote the points at which comparisons are made in OTA 16 and correspond to the initiation of the clock signal in FIG. 2. Since the analysis at this point is for a quiet pattern, the points marked S are all at the zero voltage level. With a varying analog input signal the sampling points at S where the periodic comparisons would be made would have a different value depending upon the amplitude of the input signal. It should also be noted that the transitions between high and low states in FIG. 6 denote the points at which transitions are made in the integrated signal applied to input terminal 20 and shown in FIG. 7. In this case the exclusive OR gate 58 provides a means for determining the polarity of the slope signal. The absolute value of the slope is, of course, related to the duty cycle of the signal represented in FIG. 4.

At this point it will be noted that the encoder is in fact a closed loop system and therefore the encoded digital output signal may be taken from any one of a number of places within the circuit. In the circuit of FIG. 1 the encoded digital output signal is taken from the zero or low output terminal of stage 22 of the shift register and supplied to line 70. The signal appearing on line 70 is a binary signal which represents the amplitude of the applied analog input signal. The encoded digital output signal on line 70 is then supplied to a transmission medium 72 which may take any one of a number of forms. The transmission medium 72 represented by dotted lines in FIG. 1 may be an electrical conductor or may represent a transmission through the atmosphere and in some cases may even include a satellite link.

From the foregoing description it will be noted that the second comparison performed in the pulse train generating circuitry, i.e. OTA 42, involves two signal waves which are both related to the clock signal. Thus if the clock signal should change slightly in frequency, both of the signals being compared change in the same fashion and the effect would be cancelled. Similarly, if the power supplies should drift somewhat, the quiet quasi DC level would still be at the midpoint of the sawtooth waveform because the clock waveform is symmetrical and because the clock signal enters into the development of the quiet quasi DC level. Thus, the encoder does not require balancing adjustments and is relatively immune from the effects of component and power supply variations.

The decoder section of the delta modulation transmission system, generally shown in FIG. 1 as 80, is identical to the encoder section from the shift register portion to the exclusive OR gate. The decoder 80 is in effect an open loop version of the encoder. The encoded digital signals are received from the transmission medium 72 and coupled via line 74 to the logic detection circuit of the decoder 80 comprising three shift register stages 82, 84, 86 and gates 90 and 92. The logic detection circuit of the decoder analyzes the encoded digital signal received on line 74 for runs of three. Gate 94, comparator 96 and inverter 98 provide a pulse train on line 100 whose duty cycle is directly related to the slope of the original analog input signal. After passing through a decoder exclusive OR gate 102, the pulse train is integrated in the decoder integrator circuit comprising resistor 76 and capacitor 78. The integrated signal is now an analog output signal which may be delivered to a subsequent filter. The integrator output signal then corresponds to the original analog or voice input signal.

What is claimed is:

1. A delta modulation system for translating an analog input signal into an encoded digital signal and for decoding said encoded digital signal into an analog output signal, said system comprising:

an encoder station comprising:

a. a signal comparator means for periodically comparing the amplitudes of said analog input signal and a feedback signal applied respectively to first and second input terminals thereof and for providing a comparator output signal having a first or a second voltage level at an output terminal thereof for each of said periodic comparisons;

b. an encoder pulse train generating means responsive to said comparator output signal for providing a pulse train having a duty cycle dependent upon the results of said periodic comparisons, the duty cycle of said pulse train corresponding to the slope of said analog input signal, said encoder pulse train generating means comprising:

means for generating a sawtooth waveform;

means for providing a second signal having an amplitude dependent upon the results of said comparisons in said signal comparator means; and means for comparing said second signal and said sawtooth waveform and for providing said corresponding pulse train;

c. an encoder integrating means for integrating said pulse train and for providing said feedback signal, corresponding to the integral of said pulse train, at the second input terminal of said comparator means;

d. means associated with said encoder pulse train generating means for providing said encoded digital output signal to a transmission medium; and a decoder station comprising:

a. means for receiving said encoded digital signal from said transmission medium;

b. a decoder pulse train generating means responsive to said encoded digital signal for providing a decoder pulse train having a duty cycle depending upon the encoded information in said encoded digital signal; and c. decoder integrating means for integrating said decoder pulse train and for providing said analog output signal corresponding to said analog input signal.

2. The system according to claim 1 wherein said encoder and decoder pulse train generating means each includes a multistage shift register.

3. The system according to claim 2 wherein said encoder and decoder pulse train generating means each further comprises an encoder logic detection means and a decoder logic detection means respectively coupled to the encoder shift register and the decoder shift register.

4. The system according to claim 3 wherein said encoding station further comprises an exclusive OR circuit responsive to said corresponding pulse train and a signal derived from said corresponding shift register.

5. A delta modulator circuit for translating an analog input signal into an encoded digital output signal, said circuit comprising:

a first signal comparator means for periodically comparing the amplitudes of said input signal and a feedback signal applied respectively to first and second input terminals thereof and for providing an output signal having a first or a second voltage level at an output terminal thereof for each comparison performed by said comparator;

a pulse train generating means responsive to said output signal from said first comparator means for providing a pulse train having a duty cycle dependent upon the results of said periodic comparisons, the duty cycle of said pulse train corresponding to the slope of said analog input signal, said pulse train generating means comprising:

means for generating a sawtooth waveform;

means for providing a second signal having an amplitude dependent upon the results of said comparisons in said first signal comparator means; and means for comparing said sawtooth waveform and said second signal for providing said pulse train;

integrating means for integrating said pulse train and for providing said feedback signal corresponding to the integrated value of said pulse train at said comparator second input terminal; and means associated with said pulse train generating means for providing said encoded digital output signal.

6. The circuit according to claim 5 wherein said pulse train generating means includes a multistage shift register connected to the output terminal of said first comparator means and wherein said encoded digital output signal is derived from one of the stages of said shift register.

7. The circuit according to claim 6 wherein said pulse train generating means further comprises a logic detection means connected to said shift register for detecting the occurrence of a consecutive series of first voltage levels at the output terminal of said first comparator means and for providing a binary signal in response thereto.

8. A delta modulator circuit for translating an analog input signal into an encoded digital output signal, said circuit comprising:

first comparison means for periodically comparing the amplitude of said input signal with the amplitude of a feedback signal and for providing a comparator output signal having a first voltage level when the input signal amplitude is greater than the feedback signal amplitude and for providing a second voltage level when the input signal amplitude is less than the feedback signal amplitude;

clock means for providing a clock signal;

detecting means responsive to said comparator output signal and to said clock signal for detecting the occurrence of a consecutive sequence of first voltage levels and for providing a binary signal in response thereto and for providing another signal corresponding to said clock signal in the absence of said consecutive sequence of first voltage levels;

means connected to said clock means for providing a sawtooth waveform;

means connected to said detecting means for providing a second signal wave having an amplitude dependent upon the results of the comparisons in said first comparison means;

second comparator means for comparing the amplitudes of said sawtooth waveform and said second signal wave for providing a first pulse train signal whose duty cycle is related to the comparison of the amplitudes of said sawtooth signal wave and said second signal wave;

means associated with said detecting means for providing said encoded digital output signal;

means responsive to said first pulse train and to a digital signal derived from said detecting means for providing a second pulse train; and means for integrating said second pulse train and for providing said feedback signal to said first comparison means.

9. The circuit according to claim 8 wherein said detecting means comprises:

a multi-stage shift register responsive to said first comparison means output signal; and logic means coupled to each stage of said multi-stage shift register and to said clock means.

10. The circuit according to claim 9 wherein said means for providing said second pulse train comprises an exclusive OR circuit.

11. In a delta modulator system a circuit for decoding an encoded digital signal and for providing an analog output signal, said circuit comprising:

means for receiving said encoded digital signal from a transmission medium;

a decoder pulse train generating means responsive to said encoded digital signal for providing a pulse train having a duty cycle depending upon the encoded information in said encoded digital signal said decoder pulse train generating means comprising:

means for generating a sawtooth waveform;

means for providing a second signal wave having an amplitude dependent upon the received encoded digital signal; and means for comparing said second signal wave and said sawtooth waveform for providing said decoder pulse train;

a decoder integrating means for integrating said decoder pulse train and for providing said analog output signal.

12. The circuit according to claim 11 wherein said decoder pulse train generating means includes a multistage shift register responsive to the encoded digital signal received from said transmission medium.

13. The circuit according to claim 12 wherein said decoder pulse train generating means further comprises a decoder logic detection means connected to said shift register.

14. The circuit according to claim 13 wherein said circuit further comprises an exclusive OR circuit responsive to said decoder pulse train and to a signal derived from said shift register.

* * * * *